(12) United States Patent
Chuang

(10) Patent No.: US 8,368,140 B2
(45) Date of Patent: Feb. 5, 2013

(54) TRENCH MOS DEVICE WITH SCHOTTKY DIODE AND METHOD FOR MANUFACTURING SAME

(75) Inventor: Chiao-Shun Chuang, Kaohsiung (TW)

(73) Assignee: Diodes Incorporated, Plano, TX (US)

(*) Notice: Subject to any disclaimer, the term of this patent is extended or adjusted under 35 U.S.C. 154(b) by 144 days.

(21) Appl. No.: 12/630,088

(22) Filed: Dec. 3, 2009

(65) Prior Publication Data

US 2011/0133271 A1 Jun. 9, 2011

(51) Int. Cl.
*H01L 29/66* (2006.01)
(52) U.S. Cl. .............. 257/334; 257/E29.012; 438/270
(58) Field of Classification Search .......... 257/330, 257/334, E29.012; 438/270
See application file for complete search history.

(56) References Cited

U.S. PATENT DOCUMENTS

| | | | |
|---|---|---|---|
| 6,621,107 B2* | 9/2003 | Blanchard et al. | 257/155 |
| 6,998,678 B2* | 2/2006 | Werner et al. | 257/334 |
| 7,230,297 B2* | 6/2007 | Ono et al. | 257/330 |
| 7,285,822 B2* | 10/2007 | Bhalla et al. | 257/330 |
| 7,511,336 B2* | 3/2009 | Hirler et al. | 257/330 |
| 2004/0164304 A1* | 8/2004 | Magri et al. | 257/73 |
| 2008/0206944 A1 | 8/2008 | Chuang et al. | |

* cited by examiner

Primary Examiner — John C Ingham

(57) ABSTRACT

In one embodiment the present invention includes a semiconductor device. The semiconductor device comprises a first semiconductor region, a second semiconductor region and a trench region. The first semiconductor region is of a first conductivity type and a first conductivity concentration. The trench region includes a metal layer in contact with the first semiconductor region to form a metal-semiconductor junction. The second semiconductor region is adjacent to the first semiconductor region that has a second conductivity type and a second conductivity concentration. The second semiconductor region forms a PN junction with the first semiconductor region, and the trench region has a depth such that the metal-semiconductor junction is proximate to the PN junction.

12 Claims, 5 Drawing Sheets

200

201

202

203

200

204

205

206

200

207

208

209

TRENCH MOS DEVICE WITH SCHOTTKY DIODE AND METHOD FOR MANUFACTURING SAME

BACKGROUND

The present invention relates to trench metal-oxide-semiconductor (MOS) devices, and in particular, to trench MOS devices with Schottky diode and method for manufacturing same.

Unless otherwise indicated herein, the approaches described in this section are not prior art to the claims in this application and are not admitted to be prior art by inclusion in this section.

Trench MOS devices are typically employed as transistors in power integrated circuits. Trench MOS devices may be manufactured in parallel with conventional PN diodes in order to decrease the turn-on voltage of the device when forward biased. The threshold of the MOS transistor may be designed to be much less than the 0.6V turn-on voltage of the typical PN junction. The reduction in turn-on voltage translates into a smaller voltage drop for any given current and therefore, an overall power savings for the device.

In rectifier applications, the trench MOS devices may typically have a slow switching response time such that the PN junction may be fully biased at 0.6V for a portion of time prior to the trench MOS device responding and reducing the forward voltage. The higher the frequency of the switching, the more pronounced this characteristic may be and more power may be wasted.

Thus, there is a need for improved trench MOS devices. The present invention solves these and other problems by providing trench MOS devices with Schottky diode and methods for manufacturing same.

SUMMARY

In one embodiment the present invention includes a semiconductor device. The semiconductor device comprises a first semiconductor region, a second semiconductor region and a trench region. The first semiconductor region is of a first conductivity type and a first conductivity concentration. The trench region includes a metal layer in contact with the first semiconductor region to form a metal-semiconductor junction. The second semiconductor region is adjacent to the first semiconductor region that has a second conductivity type and a second conductivity concentration. The second semiconductor region forms a PN junction with the first semiconductor region, and the trench region has a depth such that the metal-semiconductor junction is proximate to the PN junction.

The following detailed description and accompanying drawings provide a better understanding of the nature and advantages of the present invention.

DETAILED DESCRIPTION

Described herein are techniques for trench MOS devices with Schottky diodes and method for manufacturing same. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

Figure 1:
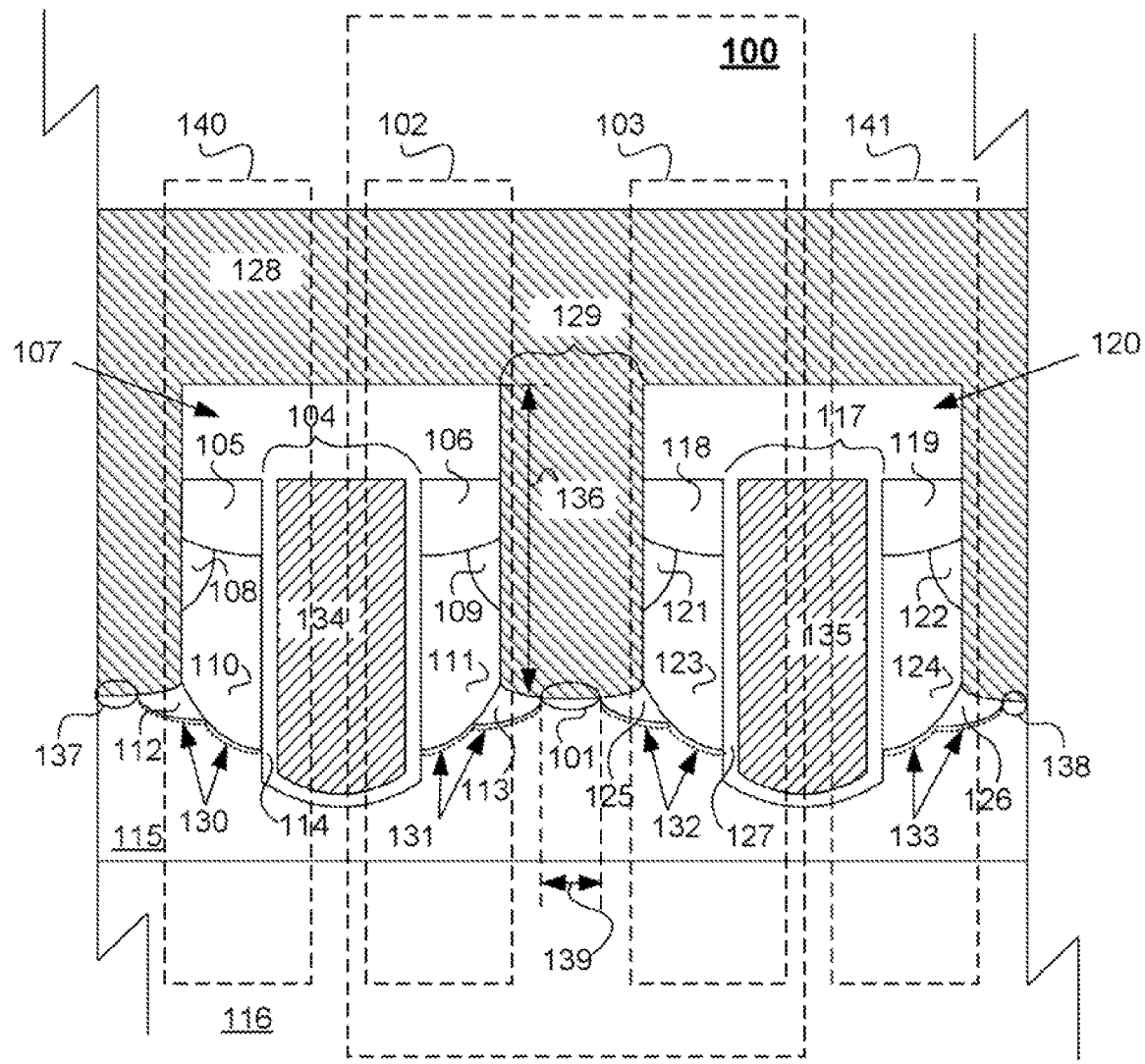
FIG. 1 illustrates a semiconductor device according to one embodiment of the present invention.

FIG. 1 illustrates a semiconductor device 100 according to one embodiment of the present invention. Semiconductor device 100 may function as a rectifier passing current in a forward biased state and blocking current in a reverse biased state. Semiconductor device 100 includes trench 129 integrated between trench MOS device 102 and trench MOS device 103. Trench 129 may be filled with metal to form a Schottky diode 101 at the bottom of the trench as described in more detail below. Trench MOS devices 102 and 103 provide a reduced turn-on voltage in the forward bias state, and Schottky diode 101 provides a reduced turn-on voltage during transitions to the forward bias state. Power may be conserved both in the forward bias state and transitions to the forward bias state by maintaining a low turn-on voltage.

Trench MOS device 102 passes current in the forward bias steady state. P+ semiconductor region 109 may have a concentration greater than P− semiconductor region 111, and may, therefore, establish a better contact with metal layer 128. Metal layer 128 may be coupled to an anode terminal of semiconductor device 100. When forward biased, current may flow from P+ semiconductor region 109 to P− semiconductor region 111. PN junction 131 may be forward biased and current may flow from P− semiconductor region 111 to n-epi region 115. Substrate 116 may receive this current and may be coupled to a cathode terminal of the semiconductor device 100. P− extension region 113 may modify the locations of PN junctions 131.

Trench MOS device 102 is configured to provide a reduction in turn-on voltage. PN junction 131 may have a turn-on voltage of 0.6V which may be reduced by low threshold MOS devices located in parallel to the junctions. Trench MOS device 102 includes N+ regions 106, P− regions 109 and 111, n-epi region 115, gate 134. Gate 134 may include a conductive material such as polysilicon. When biased greater than the threshold, gate 134 may create an inversion layer within P− region 111. This inversion layer may be located along the side portion of gate 134 beyond dielectric layer 114. This inversion layer may be initiated at a low threshold of less than 0.2V and may provide a reduction in turn-on voltage.

Trench MOS device 103 operates similarly to trench MOS device 102. Trench MOS device 103 includes gate 135, N+ semiconductor regions 118, inter-layer dielectric (ILD) 120, P+ semiconductor regions 121, P− semiconductor regions 123, P− extension regions 125, gate oxide layer 127, n-epi region 115, n+ substrate 116, and metal layer 128 which correspond to gate 134, N+ semiconductor region 106, inter-layer dielectric (ILD) 107, P+ semiconductor region 109, P− semiconductor region 111, P− extension region 113, gate oxide layer 114, n-epi region 115, n+ substrate 116, and metal layer 128 of trench MOS device 102.

Schottky diode 101 provides a fast switching diode with a low threshold which may reduce the turn-on voltage during transitions. Semiconductor device 100 may switch as a rectifier and the low threshold MOS devices in parallel with the PN junctions may not respond quickly enough. The turn-on voltage of Schottky diode 101 may be a few tenths of a volt and may have a quick response time. Schottky diode 101 is formed between the metal-semiconductor junction between n-epi region 115 and metal layer 128. The location of Schottky diode 101 may aid in reducing the turn-on voltage of semiconductor device 100 during transitions.

Width 139 of Schottky diode 101 may be adjusted by P− extension regions 113 and 125. The wider the P− extensions 113 and 125 become, the smaller the width 139 of Schottky diode 101. Width 139 may be reduced to improve the reverse leakage. Reduction in width 139 may also increase the turn-on voltage characteristic of Schottky diode 101.

Trench region 129 has a depth 136 which places Schottky diode 101 proximate with PN junctions 131 and 132. PN junction 131 curves upward from an intersection with a lower side of trench 104 to an intersection with the bottom of trench 129. P− extension 113 adjusts the placement of the intersection of PN junction 131 with trench 129 and P− semiconductor region 111 defines the intersection of PN junction 131 with trenches 104 and 129. The width of P− semiconductor region 111 as well as the depth 136 may influence current flow and speed at which Schottky 101 may reduce the turn-on voltage during transitions.

Semiconductor device 100 may also include additional trench MOS devices 140-141. Trench MOS devices 140 and 141 may be formed as complimentary structures to trench MOS devices 102 and 103, respectively, and function in a similar manner Trench MOS device 140 includes gate 134, N+ semiconductor regions 105, inter-layer dielectric (ILD) 107, P+ semiconductor region 108, P− semiconductor regions 110, P− extension regions 112, gate oxide layer 114, n-epi region 115, n+ substrate 116, and metal layer 128 which correspond to gate 134, N+ semiconductor region 106, inter-layer dielectric (ILD) 107, P+ semiconductor region 109, P− semiconductor region 111, P− extension region 113, gate oxide layer 114, n-epi region 115, n+ substrate 116, and metal layer 128 of trench MOS device 102. P− extension 112 also may contribute to the width of Schottky diode 137. PN junction 130 may be proximate to Schottky diode 137.

Trench MOS device 141 includes gate 135, N+ semiconductor regions 119, inter-layer dielectric (ILD) 120, P+ semiconductor region 122, P− semiconductor regions 124, P− extension regions 126, gate oxide layer 127, n-epi region 115, n+ substrate 116, and metal layer 128 which correspond to gate 135, N+ semiconductor region 118, inter-layer dielectric (ILD) 120, P+ semiconductor region 121, P− semiconductor region 123, P− extension region 125, gate oxide layer 127, n-epi region 115, n+ substrate 116, and metal layer 128 of trench MOS device 103. P− extension 126 may contribute to the width of Schottky diode 138. PN junction 133 may be proximate to Schottky diode 138.

Figure 2A:
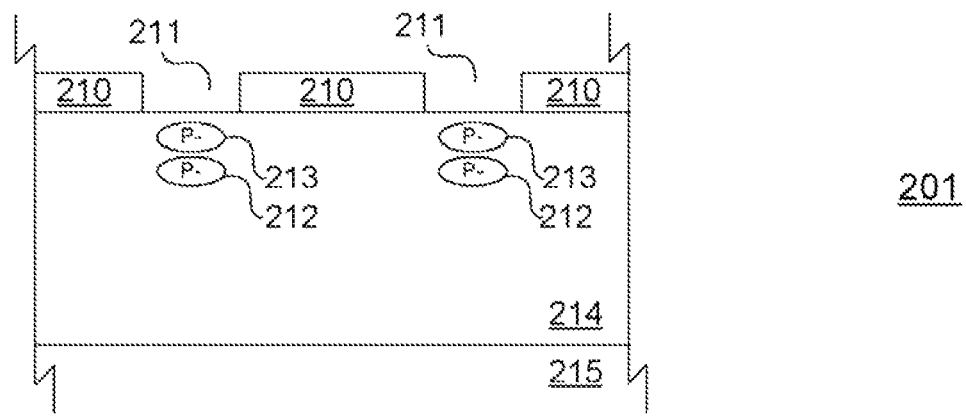
FIG. 2A-C illustrates a method for manufacturing a semiconductor device according to one embodiment of the present invention.
Figure 2A:
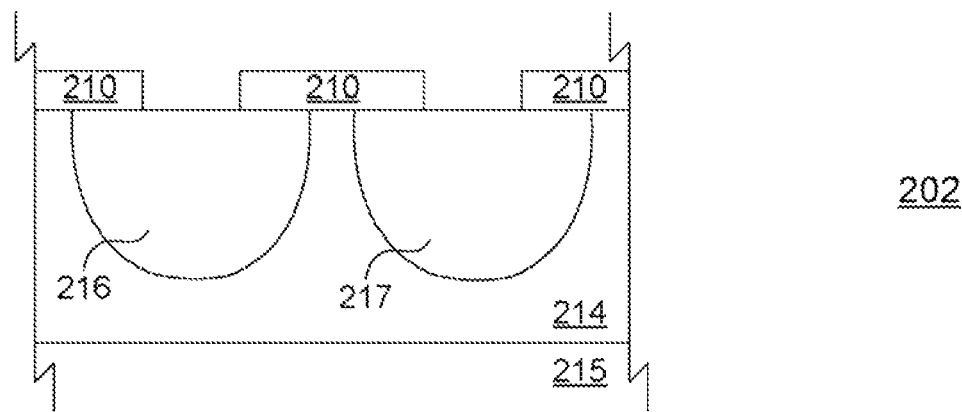
Figure 2A:
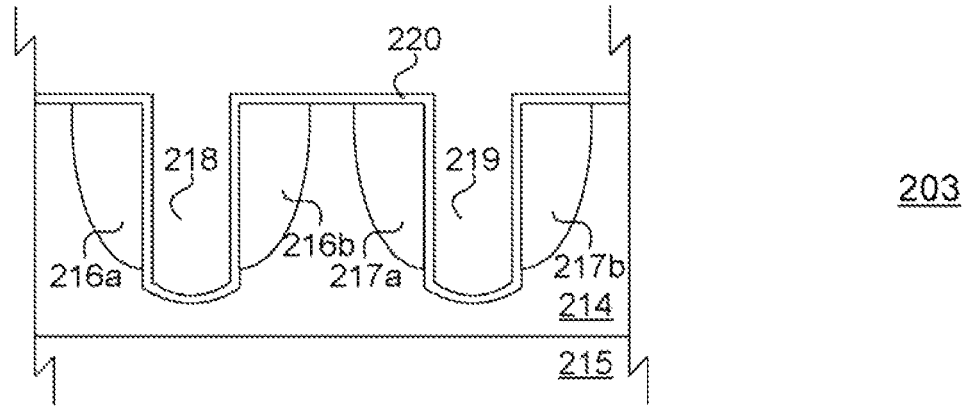
Figure 2B:
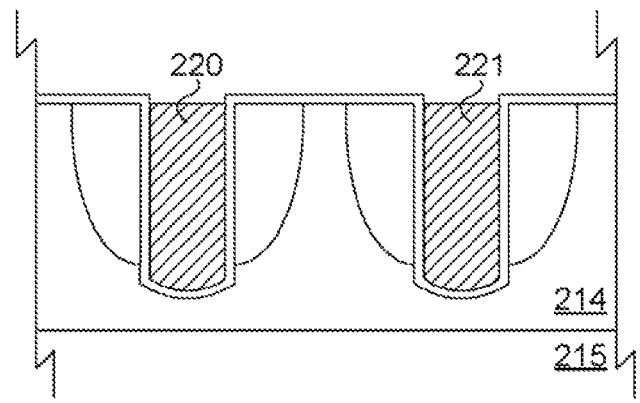
Figure 2B:
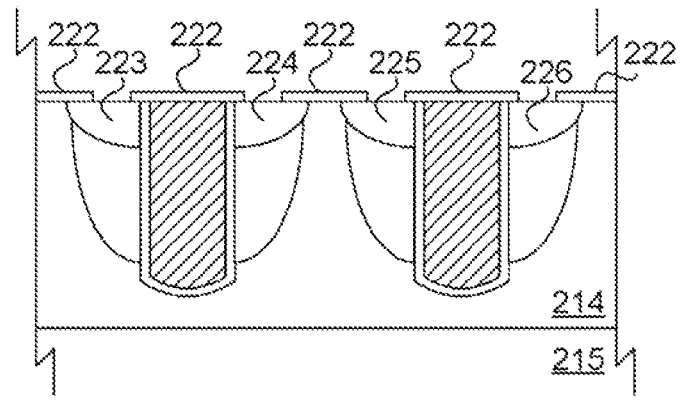
Figure 2B:
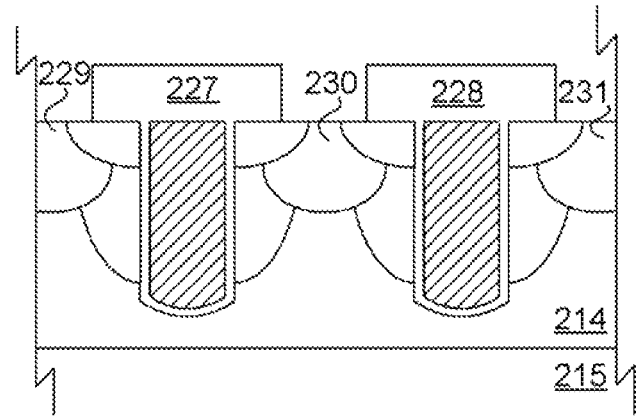
Figure 2C:
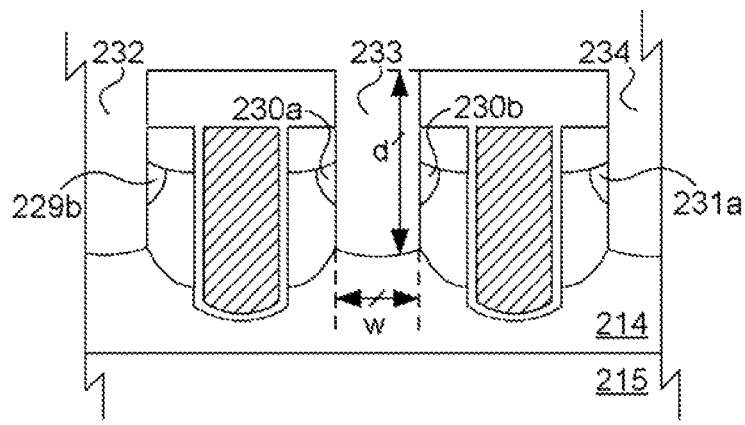
Figure 2C:
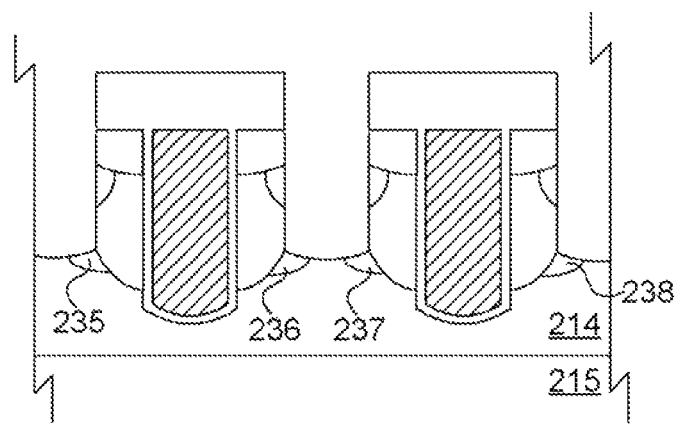
Figure 2C:
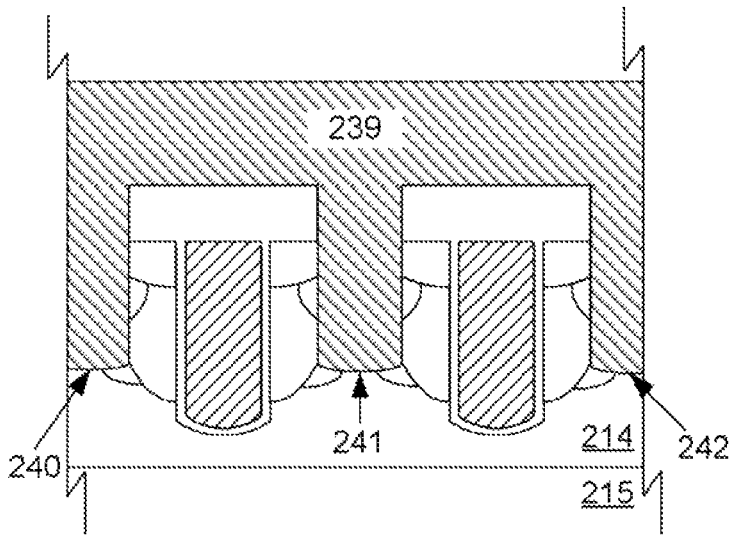

FIG. 2A-C illustrates a method 200 for manufacturing a trench MOS device according to one embodiment of the present invention.

At 201, mask oxide 210 may be deposited on the surface of a n-epi region 214 residing atop a n-type substrate region 215. A chemical vapor deposition (CVD) process may be used to deposit mask oxide 210. A trench photo is used to make openings 211 in mask oxide 210. P type material 212-213 may be implanted in two steps by first providing a high energy implant 212 followed by a lower energy implant 213. At 202, the P-body may be driven to form P− semiconductor regions 216 and 217 within n-epi region 214.

At 203, trenches 218 and 219 may be etched into P− semiconductor regions 216 and 217 to a depth deeper than the depth of the P regions 216/217. Trench 218 splits P− semiconductor region 216 into region 216a and 216b. Trench 219 splits P− semiconductor region 217 into region 217a and 217b. The mask oxide 210 has been removed and gate oxide 220 may be added. At 204, polysilicon may be added and then etched back to form gates 220 and 221. At 205, a source photo mask 222 may be used to provide source implant. After driving-in the source implant, N+ semiconductor regions 223-226 may result.

At 206, a CVD process may be used to provide ILD regions 227 and 228. Additionally, a contact photo may be used to etch through the ILD. A P+ semiconductor regions 229-231 may be formed by adding P+ implant and driving-in the implant.

At 207, trenches 232-234 are etched. Trench 233 has a depth d and a width w. Trenches 232 and 234 may also have a similar depth and width. The etching may be deeper than, and cut through, P+ region 229-231. This may result in P+ regions 229b, 230a, 230b, and 231a. At 208, an implant of P− material may be added to form P− extension regions 235-238. At 209, metal layer 239 is added and a metal-semiconductor junction is formed at location 240-242.

Figure 3:
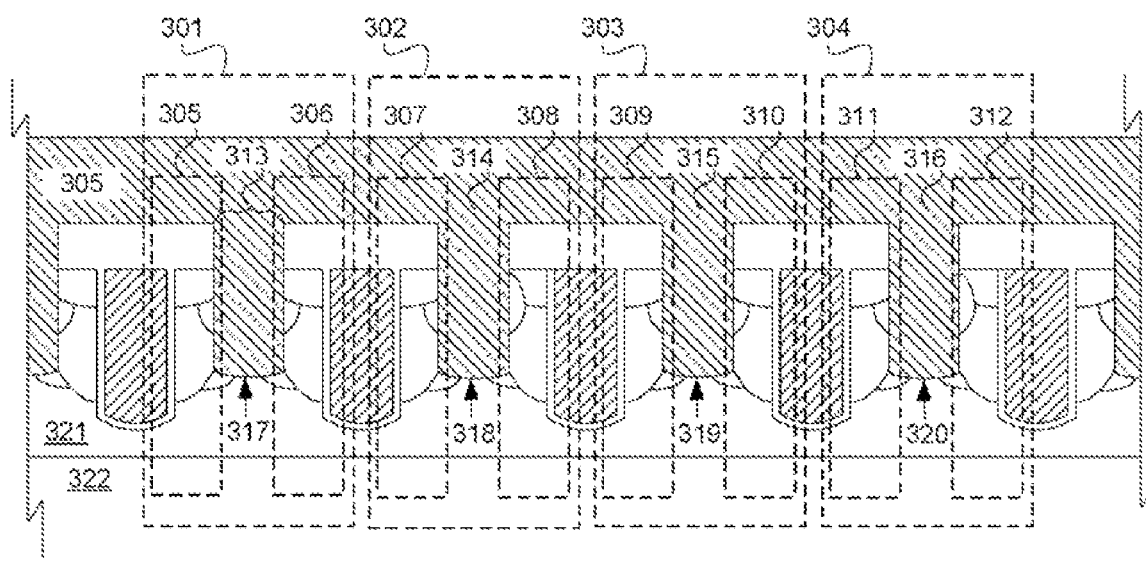
FIG. 3 illustrates cross section of a semiconductor device having a plurality of trench MOS devices and Schottky diodes according to one embodiment of the present invention.

FIG. 3 illustrates cross section of semiconductor device 300 using a plurality of trench MOS devices (e.g. MOS devices 305-312) according to one embodiment of the present invention. Semiconductor device 300 includes diodes 301-304. Diode 301 includes Schottky diode 317 integrated within trench 313 and located between trench MOS devices 305 and 306. Diode 302 includes Schottky diode 318 integrated within trench 314 and located between trench MOS devices 307 and 308. Diode 303 includes Schottky diode 319 integrated within trench 315 and located between trench MOS devices 309 and 310. Diode 304 includes Schottky diode 320 integrated within trench 316 and located between trench MOS devices 311 and 312. Semiconductor device 300 uses a plurality of trenches to place a plurality of Schottky diodes (e.g. Schottky diodes 317-320) and MOS devices (e.g. trench MOS devices 305-312) in parallel with a plurality of PN junctions in order to reduce the turn-on voltage of diodes 301-304 in a forward bias state and during transitions to the forward bias state. Power may be conserved both in the forward bias state and transitions to the forward bias state by maintaining a low turn-on voltage.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. A semiconductor device comprising:
   a first semiconductor region of a first conductivity type and a first conductivity concentration;
   a first trench including a metal layer in contact with said first semiconductor region to form a metal-semiconductor junction;
   a second semiconductor region adjacent to said first semiconductor region and the metal-semiconductor junction, the second semiconductor region having a second conductivity type and a second conductivity concentration, wherein said second semiconductor region forms a PN junction with said first semiconductor region; and
   a third semiconductor region of said second semiconductor type and said second semiconductor concentration that is adjacent to said second semiconductor region and said metal layer and extends below a portion of a bottom of said first trench, wherein said third semiconductor region extends said PN junction to form an extended PN junction portion, and wherein said PN junction curves upward at a first angle toward the first trench, said extended PN junction portion curves upward at a second angle to the first trench, and said second angle is different from said first angle.

2. The semiconductor device of claim 1 further comprising a second trench and a conductive material within said second trench, wherein said second semiconductor region is between said first and second trenches.

3. The semiconductor device of claim 2 further comprising a dielectric layer between said conductive material and said second semiconductor region, wherein said conductive material and said dielectric layer form a gate within said second trench which, when biased, creates an inversion layer within said second semiconductor layer.

4. The semiconductor device of claim 3 further comprising a fourth semiconductor region of said first semiconductor type, wherein said fourth semiconductor region is adjacent to said second semiconductor region and said first trench, and wherein the first semiconductor region, the second semiconductor region, fourth semiconductor region, said dielectric layer, and said conductive material form a trench MOS device.

5. The semiconductor device of claim 2 wherein a depth of said second trench is greater than a depth of said first trench, and wherein said PN junction curves upward from an intersection with said second trench to an intersection with said first trench.

6. The semiconductor device of claim 1 further comprising a fourth semiconductor region of said second semiconductor type adjacent to the second semiconductor region and the first trench, wherein said fourth semiconductor region defines a width in which said metal layer is in contact with said first semiconductor region.

7. The circuit of claim 1, wherein said third semiconductor region extends said PN junction below said portion of said bottom of said first trench.

8. A method comprising:

forming a first semiconductor region of a first conductivity type and a first conductivity concentration within a second semiconductor region of a second conductivity type and a second conductivity concentration;

etching a first trench through said first semiconductor region;

forming a third semiconductor region of a first conductivity type at a bottom left portion and a bottom right portion of said first trench in said second semiconductor region, adding a metal layer within said first trench such that said metal layer contacts said second semiconductor region to form a metal-semiconductor junction, wherein said metal-layer contacts said second semiconductor region and said third semiconductor region between said bottom left portion and said bottom right portion of said first trench;

wherein said first semiconductor region forms a PN junction with said second semiconductor region, wherein said third semiconductor region extends said PN junction to form an extended PN junction portion, and wherein said PN junction curves upward at a first angle toward the first trench, said extended PN junction portion curves upward at a second angle to the first trench, and said second angle is different from said first angle, and wherein said first trench has a depth such that said metal-semiconductor junction is adjacent to said PN junction.

9. The method of claim 8 further comprising:
etching a second trench; and
adding a conductive material within said second trench,
wherein said first semiconductor region is between said first and second trench regions.

10. The method of claim 9 further comprising:
adding a dielectric layer between said conductive material and said first semiconductor region, wherein said conductive material and said dielectric layer form a gate within said
trench which, when biased, creates an inversion layer within said first semiconductor region.

11. The method of claim 9 wherein a depth of said second trench is greater than said depth of said first trench, and wherein said forming said first semiconductor region includes forming a curved boundary such that said PN junction curves upward at the first angle from an intersection with said second trench toward said first trench.

12. The method of claim 8 further comprising:
forming a fourth semiconductor region of said second semiconductor type,
wherein said third semiconductor region is above said first semiconductor region and adjacent to said first trench, and wherein said fourth semiconductor concentration is greater than said first semiconductor concentration.

* * * * *